US009252816B1

(12) United States Patent
Steiner et al.

(10) Patent No.: US 9,252,816 B1
(45) Date of Patent: Feb. 2, 2016

(54) FALSE ERROR CORRECTION DETECTION

(71) Applicant: DENSBITS TECHNOLOGIES LTD., Haifa (IL)

(72) Inventors: Avi Steiner, Kiriat Motzkin (IL); Hanan Weingarten, Herzelia (IL)

(73) Assignee: DENSBITS TECHNOLOGIES LTD., Haifa (IL)

( * ) Notice: Subject to any disclaimer, the term of this patent is extended or adjusted under 35 U.S.C. 154(b) by 30 days.

(21) Appl. No.: 14/293,721

(22) Filed: Jun. 2, 2014

(51) Int. Cl.
*H03M 13/00* (2006.01)
*H03M 13/29* (2006.01)
*H03M 13/15* (2006.01)

(52) U.S. Cl.
CPC ........ *H03M 13/2909* (2013.01); *H03M 13/152* (2013.01); *H03M 13/2918* (2013.01); *H03M 13/2927* (2013.01)

(58) Field of Classification Search
CPC ...................... H03M 13/2918; H03M 13/2927
See application file for complete search history.

(56) References Cited

U.S. PATENT DOCUMENTS

| 8,560,915 | B2 * | 10/2013 | Rumbolt | H03M 13/2909 714/755 |
| 2011/0099452 | A1 * | 4/2011 | Rumbolt | H03M 13/2909 714/755 |
| 2013/0132794 | A1 * | 5/2013 | Rumbolt | H03M 13/2909 714/755 |
| 2014/0245086 | A1 * | 8/2014 | Zaytsev | H03M 13/015 714/703 |

* cited by examiner

*Primary Examiner* — M. Mujtaba K Chaudry
(74) *Attorney, Agent, or Firm* — Dentons US LLP

(57) ABSTRACT

A method of decoding an array of multi-dimensional code components, the method may include searching in a group of multi-dimensional code components a suspected multi-dimensional code component, wherein the suspected multi-dimensional code component belongs to the array multi-dimensional code components and is associated with a false correction probability that exceeds a false correction threshold; wherein the searching comprises dummy decoding, by a decoder, the group of multi-dimensional code components; and performing at least one non-dummy decoding of multi-dimensional code components of the array without performing non-dummy decoding of the suspected multi-dimensional code component.

22 Claims, 12 Drawing Sheets

FALSE ERROR CORRECTION DETECTION

BACKGROUND

Multi-dimensional codes are widely used due to their potential efficiency. It is usually impractical to implement optimal decoding in the sense of maximal probability per information bit, such as maximum likelihood (ML) decoding, since the complexity may grow rapidly. To approximate the performance of ML decoding, it is proposed to perform a sub-optimal linear complexity decoding. The method is mainly suitable, but not limited, to concatenated multi-dimensional Bose-Chaudhuri-Hocquengham (BCH) codes.

FIG. 1A illustrates a prior art multi dimensional folded code that has p dimensions, wherein p is a positive integer. Each dimension may correspond a different ordering of the input data, and coded with BCH codes—each dimension is generated by applying a BCH code on data or on codewords of a previous dimension. The data to the codes may be folded over several columns or rows in order to obtain higher rate codes.

FIG. 1A illustrates a two dimensional folded code (p=2). In the example, a stream of data (also referred to as data) is divided into four parts, each part is encoded (using a BCH code) and a redundancy is appended to the end of that part. Each of these codewords (also referred as first codewords) are then folded into three columns which constitute (what we call) an outer code.

Matrix 100 of FIG. 1A includes thirteen columns 110(1)-110(13) and sixteen rows 120(1)-129(16). It stores four first codewords such as first codeword 130(1). Each first codeword includes thirty three data bits and three redundancy bits. First codeword 130(1) includes data bits 131(1) and redundancy bits 132(1). First codeword 130(2) includes data bits 131(2) and redundancy bits 132(2). First codeword 130(3) includes data bits 131(3) and redundancy bits 132(3). First codeword 130(4) includes data bits 131(4) and redundancy bits 132(4).

Each first codeword is stored in a folded manner in matrix 100. In other words matrix 100—stores folded version of each first codeword.

A second encoding process is appended on the first twelve bits of each two adjacent rows of matrix 100 to provide second codewords. The redundancy bits are stored in the thirteenth column 100(13) of matrix 100.

By grouping together the columns of the resultant outer code, a matrix is provided which is then divided into rows. Each one or more rows then constitute the data for another BCH encoding process to provide inner codewords. The redundancies of the inner code are grouped together and appended to the sequence of outer codewords.

It is noted that the inner codes and the outer codes may differ in that the redundancy of the outer code is also encoded by the inner code while the inner code's redundancy is not further encoded. Yet a further code may be appended to protect the redundancies of the inner codes.

The rate of the codes may be configured in several ways. For example, the length of the data/redundancy can differ from one code to another. The number of rows/columns for each code may be modified. Zero padding may be added to the matrix in order to complete the outer codes to full columns.

One important challenge during multi-dimensional decoding in hard/soft decoding is to identify false corrections (sometimes called miss-corrections)—these are situations where the decoder returns a valid correction of a codeword, which does not recover the original payload.

SUMMARY

According to an embodiment of the invention various methods, non-transitory computer readable media, and systems may be provided and are described in the specification.

A method of managing a non-volatile memory device, the method may include searching in a group of multi-dimensional code components a suspected multi-dimensional code component, wherein the suspected multi-dimensional code component belongs to the array multi-dimensional code components and is associated with a false correction probability that exceeds a false correction threshold; wherein the searching may include dummy decoding, by a decoder, the group of multi-dimensional code components; and performing at least one non-dummy decoding of multi-dimensional code components of the array without performing non-dummy decoding of the suspected multi-dimensional code component.

The searching may be preceded by performing one or more non-dummy decoding of multi-dimensional code components of the array.

The searching may be followed by setting a decoder state to a decoder state that existed immediately before searching for the suspected multi-dimensional code component.

The performing of the at least one non-dummy decoding may be followed by performing additional non-dummy decoding of multi-dimensional code components of the array, the additional non-dummy decoding comprise non-dummy decoding of the suspected multi-dimensional code component.

The performing of the at least one non-dummy decoding may be followed by performing a new multi-dimensional code components search for new suspected multi-dimensional code components, followed by additional non-dummy decoding of multi-dimensional code components that differ from the new suspected multi-dimensional code components.

The performing of the additional non-dummy decoding may be preceded by checking, after performing the at least one non-dummy decoding of multi-dimensional code components of the array, the false correction probability associated with the suspected multi-dimensional code component and determining that the false correction probability associated with the suspected multi-dimensional code component has lowered below the false correction threshold.

The performing of the at least one non-dummy decoding of the multi-dimensional code components may include non-dummy decoding all multi-dimensional code components of the array except the suspected multi-dimensional code component.

The performing of the at least one non-dummy decoding of the multi-dimensional code components may include performing a plurality of dimension non-dummy decoding of the multi-dimensional code components.

The method may include preforming multiple repetitions of a sequence of stages that may include (a) the searching for the suspected multi-dimensional code component and (b) the performing of the at least one non-dummy decoding of the multi-dimensional code components of the array without performing non-dummy decoding of the suspected multi-dimensional code component The method may include limiting a number of repetitions of the sequence of stages.

The dummy decoding differs from the non-dummy decoding by at least one decoding parameter.

The multi-dimensional code components are associated with a set of dimensions and wherein the searching for the suspected multi-dimensional code component may include searching in code components associated with a sub-set of the dimensions.

The searching may include assigning to each multi-dimensional code component of the group of multi-dimensional code components at least two different scores; and determining which of the multi-dimensional code components of the group of multi-dimensional code component may be the suspected multi-dimensional code component in response to the at least two different scores of each multi-dimensional code component of the group of multi-dimensional code components.

The searching may include assigning to each multi-dimensional code component of the group of multi-dimensional code components at least one score; and determining which of the multi-dimensional code components of the group of multi-dimensional code component may be the suspected multi-dimensional code component in response to the at least one score of each multi-dimensional code component of the group of multi-dimensional code components.

The searching may include assigning to each multi-dimensional code component of the group of multi-dimensional code components a score indicative of a number of times the code component was corrected.

The dummy decoding may include performing multiple dummy decoding iterations.

The method may include stopping the dummy decoding iterations when reaching a predefined number of dummy decoding iterations.

The method may include stopping the dummy decoding iterations when reaching a predefined duration of dummy decoding.

The method may include determining to perform the searching in the group of multi-dimensional code components if a number of unresolved multi-dimensional code components exceeds an unresolved multi-dimensional code components threshold.

The performing of the at least one non-dummy decoding of multi-dimensional code components of the array may include non-dummy decoding of multi-dimensional code components associated with more than the subset of dimensions without performing non-dummy decoding of the suspected multi-dimensional code component There may be provided a non-transitory computer readable medium that stores instructions that once executed by a memory controller cause the memory controller to search in a group of multi-dimensional code components a suspected multi-dimensional code component, wherein the suspected multi-dimensional code component belongs to an array of multi-dimensional code components and may be associated with a false correction probability that exceeds a false correction threshold; wherein the searching may include dummy decoding, by a decoder, the group of multi-dimensional code components; and perform at least one non-dummy decoding of multi-dimensional code components of the array without performing non-dummy decoding of the suspected multi-dimensional code component.

There may be provided a device may include a memory controller and a non-volatile memory device; wherein the memory controller may be arranged to search in a group of multi-dimensional code components a suspected multi-dimensional code component, wherein the suspected multi-dimensional code component belongs to an array of multi-dimensional code components and may be associated with a false correction probability that exceeds a false correction threshold; wherein the searching may include dummy decoding, by a decoder, the group of multi-dimensional code components; and perform at least one non-dummy decoding of multi-dimensional code components of the array without performing non-dummy decoding of the suspected multi-dimensional code component.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1A:
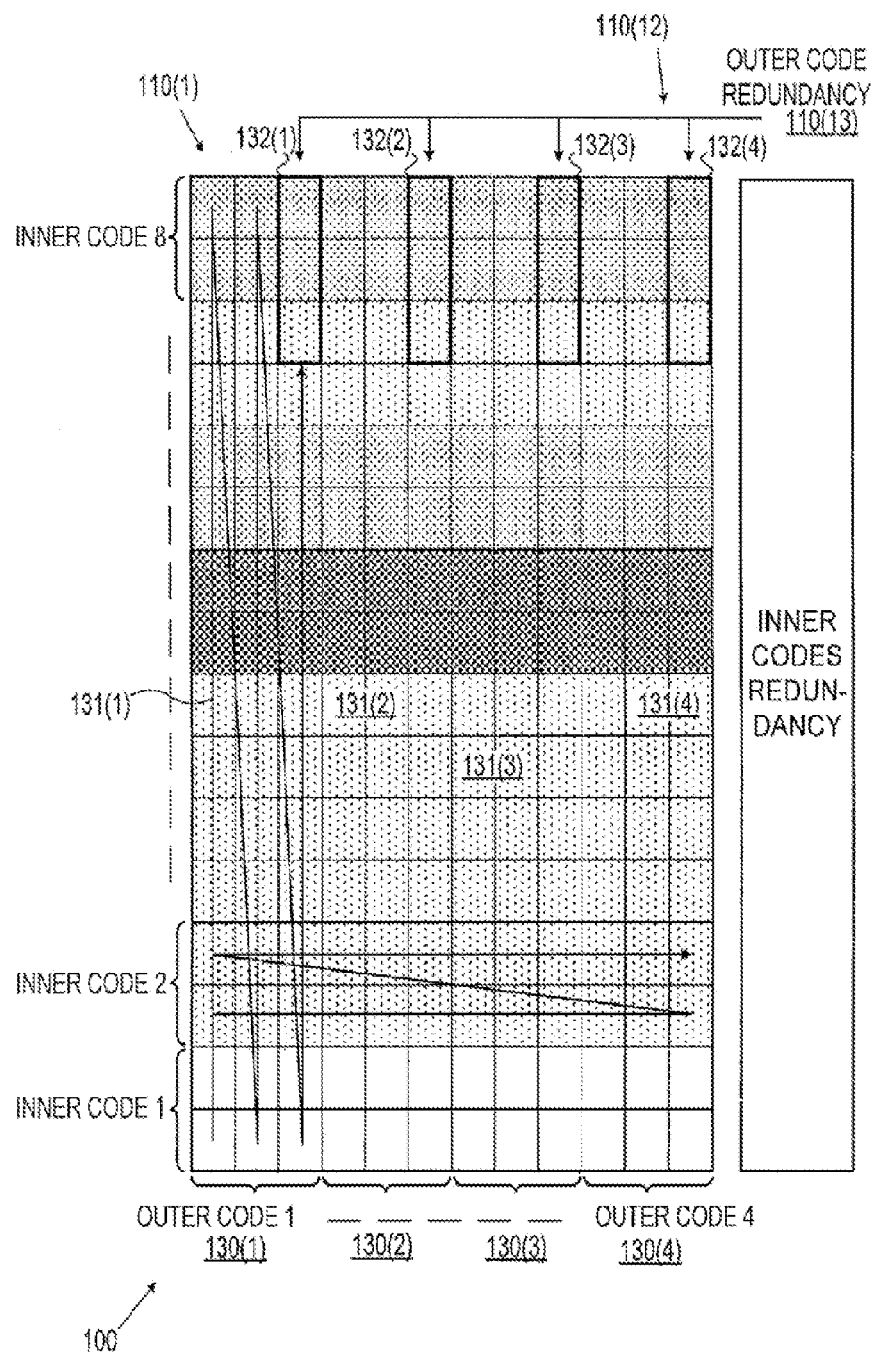
FIG. 1A illustrates a prior art folded multi-dimensional code.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE DRAWINGS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method and should be applied mutatis mutandis to a non-transitory computer readable medium that stores instructions that once executed by a computer result in the execution of the method.

Any reference in the specification to a system should be applied mutatis mutandis to a method that may be executed by the system and should be applied mutatis mutandis to a non-transitory computer readable medium that stores instructions that may be executed by the system.

Any reference in the specification to a non-transitory computer readable medium should be applied mutatis mutandis to a system capable of executing the instructions stored in the non-transitory computer readable medium and should be applied mutatis mutandis to method that may be executed by a computer that reads the instructions stored in the non-transitory computer readable medium.

The method can be applied when performing multi-dimensional decoding. Non-limiting examples of multi-dimensional decoding are illustrated in the following patents and patent applications which are incorporated herein by reference:

U.S. Pat. No. 8,341,502,

U.S. patent application Ser. No. 13/036,796 titled SYSTEM AND METHOD FOR MULTI-DIMENSIONAL DECODING, U.S. patent application Ser. No. 12/651,489 titled ENCODING METHOD AND SYSTEM, DECODING METHOD AND SYSTEM, U.S. patent application Ser. No. 13/917,069 titled SIZE LIMITED MULTI-DIMENSIONAL DECODING, U.S. patent application Ser. No. 14/049,547 titled SYSTEM AND METHOD FOR IRREGULAR MULTIPLE DIMENSION DECODING AND ENCODING, and U.S. patent application Ser. No. 13/171,215 titled SYSTEM AND METHOD FOR MULTI-DIMENSIONAL ENCODING AND DECODING.

The method aims to reduce the non-negligible false correction probability for decoding a BCH component code. In a multi-dimensional code constructed with multiple BCH component codes, usually each BCH component may be capable of correcting only a few errors. In such cases, the code components have a weak miss-correction detection capability, and thus may arrive at false corrections.

As an embodiment of this invention, it is suggested to perform dummy decoding iterations in order to identify packets (or component codes) false correction. Once false corrections are identified in dummy iterations, it is possible to apply iterative decoding which avoids decoding the packets/components, which are suspected to produce false corrections. Thus false correction elimination (FCE) is obtained. As the iterations progress, the probability of arriving at a false correction reduces, and packets that were suspected on initial iterations might be used on later iterations. This basic concept is adopted for hard decoding, where the input is a binary vector, and for soft decoding where soft information per bit is available at the input. For each decoding scheme, there is a slightly different flavor of false correction detection.

There is provided a method for multi-dimensional decoding that includes false correction elimination (FCE) for both hard and soft decoding. FCE includes performing dummy iterations, which are used for identifying problematic packets (component codes), and avoid using the problematic component codes during one or more next decoding iterations.

Problematic code components are identified by assigning one or more FCE scores per code component. The method may assign two or more FCE scores for ranking suspicious packets as false corrections, during the FCE.

The FCE may be applied in one or more FCE activation modes. The FCE activation modes may differ from each other by the FCE scores that are calculated, by their length, stop conditions, initialization conditions, by the type of decoding process applied (hard decoding, soft decoding, type of soft decoding, performing soft decoding score (such as LLR) clipping, execution of intersection decoding, list decoding and the like).

For example—one activation mode may include starting the FCE with no excluded packet. Yet for another example—after performing one or more decoding iterations an FCE may initiated while taking into account code components that were found to be problematic.

The FCE can be complexity limited—by (a) setting a maximal number of decoding iterations within FCE detection, (b) setting a maximal number of FCE activations for creating the excluded packets list (before an outer iteration), (c) setting a limit to the number of outer iteration for which FCE is used, (d) using FCE only if the number of unsolved packets exceeds some threshold.

The following describes the details of the list decoding methods for the multi-dimensional codes.

Soft Decoding Overview

The description of the invention, in this section, relies on the assumption that the multi-dimensional codes underhand correspond to multi-dimensional folded BCH codes with encoding scheme as disclosed in the patent applications and patents listed above.

FIG. 1 demonstrates a voltage threshold distribution of a multi-level cell (MLC) flash memory. The MLC is a two bit per cell (bpc) flash memory cell and his voltage threshold distribution includes four lobes 10-13 that correspond to four different logical levels. The most significant bit (MSB) page type can read with a single threshold (MSB page hard threshold $Xth,1$ 30) when the number of errors is sufficiently low. Otherwise, if the ECC cannot correct the errors using a single read, a digital signal processing (DSP) unit may perform multiple reads to obtain soft information at the decoder input. The soft information may be obtained by reading for example at the designated thresholds around the hard input threshold. From the multiple reads, the soft information may be computed, in the form of log-likelihood ratio (LLR). For reading the least significant bits (LSB) stored on same row, the decoder reads using two thresholds, defined as LSB page hard thresholds in FIG. 1A ((LSB page hard thresholds $Xth,0$ 20 and $Xth,2$ 40). If hard decoding cannot be successfully completed due to high error rate, the decoder may be provided by soft information obtained from multiple reads (using, for example, four additional soft thresholds per hard threshold such as LSB page SOFT thresholds 21-24 that surround $Xth,0$ 20, MSB page SOFT thresholds 31-34 that surround $Xth,1$ 30 and LSB page SOFT thresholds 41-44 that surround $Xth,2$ 40). Soft decoding relates to the decoding using soft input information, and providing hard output associated with the corrected information bits.

For soft decoding of a BCH component, code (also termed as packet) soft information per bit is required. This is obtained by performing multiple reads from the Flash, where each read operation uses different read thresholds. The read thresholds must be configured such that soft metrics, called LLR, can be computed per bit. The definition of an LLR is $$LLR(b_i) = \log\left(\frac{P(b_i = 1)}{P(b_i = 0)}\right) \quad (1)$$

where $b_i$ is the i-th bit of some page. The LLR expression can be substantially simplified, for an additive white Gaussian noise (AWGN) channel model. The AWGN is also a good approximation in many cases for the Flash voltage threshold distribution. By assuming an AWGN channel, $$P(b_i \mid y) = \frac{1}{\sqrt{2\pi\sigma^2}} \exp\left(-\frac{(y - b_i)^2}{2\sigma^2}\right) \quad (2)$$

where y is the AWGN channel output. It is straightforward to show that the LLR(b) becomes $$LLR(b_i) = \frac{2y}{\sigma^2} \quad (3)$$

Where the LLR per bit is created during the multiple Flash reads, as a quantized version of an AWGN channel. The quantization level per threshold is directly determined by the number of reads, as the base-two logarithm of the read counter. Once, the multiple reads have been performed, and LLRs are available for all codeword bits, the decoding process may begin. Iterative soft decoding includes the process of performing soft decoding on some of the code components, and applying the most likely corrections (under different conditions, as will be elaborated here). On some code components, it may be desired to perform only hard decoding. An example for such code can be a 3D code where the outer components are BCH codes which correct t>4 errors. If this code has inner-1 and inner-2 BCH components with decoding capability of t<4, then soft decoding may be efficiently implemented here (in terms of computational complexity, and hardware implementation).

Soft Decoding of a Single Component Code

Soft decoding of a single component code may consist of the following main steps:
a. Sort component indices from the least reliable to the $N^{th}$ least reliable bit. The least reliable bits may be those having lowest $|LLR(b_i)|$, i.e. lower absolute value LLR.
b. Choose error bits' hypotheses according to minimal sum LLR from within the sorted indices.
c. For every hypothesis, perform hard decoding.
d. For every hypothesis with a valid hard decoding solution (i.e. miss-correction=0), compute $$score = \sum_{i \in Hyp} |LLR(b_i)| \quad (4)$$

where Hyp corresponds to the group of inverted bits and the hard decoding solution indices. These together suggest a decoding hypothesis.

e. Save the solution with the lowest score as the most likely candidate, and save also the second best hypothesis, with the second lowest score.

For efficiently decoding a BCH component code a decoding engine may include a syndrome update module, which is performed according to the error hypothesis, then for codes with t≤4 the error locating polynomial (ELP) may be efficiently generated, and the ELP may also be efficiently solved [C. Chen, "Formulas for the Solutions of Quadratic Equations over GF(2m)", IEEE Trans. On Information Theory, vol. 28, no. 5, 1982]. In case the decoding is successful (i.e. missCorrection=0) for a certain hypothesis, the sum-LLR, as in (4), is computed, and a decision on whether or not to apply the correction can be made by the decoder. Conditions for applying the soft suggested corrections are disclosed here.

The process described above is done over a set of predefined hypotheses, and usually the hypothesis with the lowest score is considered as the most likely valid correction. This correction will be implemented in case it complies with several conditions as will be described next. In cases where many errors exist, the nearest valid codeword in the sense of minimal score as computed in (4) may be a false correction. In order to reduce probability of accepting false corrections, an iterative decoding process is used, where after each dimension decoding, only a subset of suggested correction hypotheses are accepted. The subset is determined by the more likely hypotheses, e.g. those with a minimal score as computed in (4), out of all component codes that were processed in the current dimension. These selected corrections are implemented, and then soft decoding on the other dimension is done, by repeating the same steps described above. Some of the steps were already introduced in some of the patent application listed above.

In order have a meaningful impact of every accepted correction during the per component decoding, the decoder may use a mechanism of LLR clipping, which changes to values of the LLRs within the corrected component code to a maximal value, such that the soft decoder of other components is not likely to change any of the bits which belong to an already corrected component code, as introduced in some of the patent applications listed above.

To minimize the effect of accepting false corrections within the iterative decoding process, it is suggested to follow the disclosed methods via FCE, which basically use dummy decoding iterations to identify false corrections, and then avoid using these packets for the next iteration obtaining FCE.

Soft FCE—Specific embodiments of the invention

Figure 2:
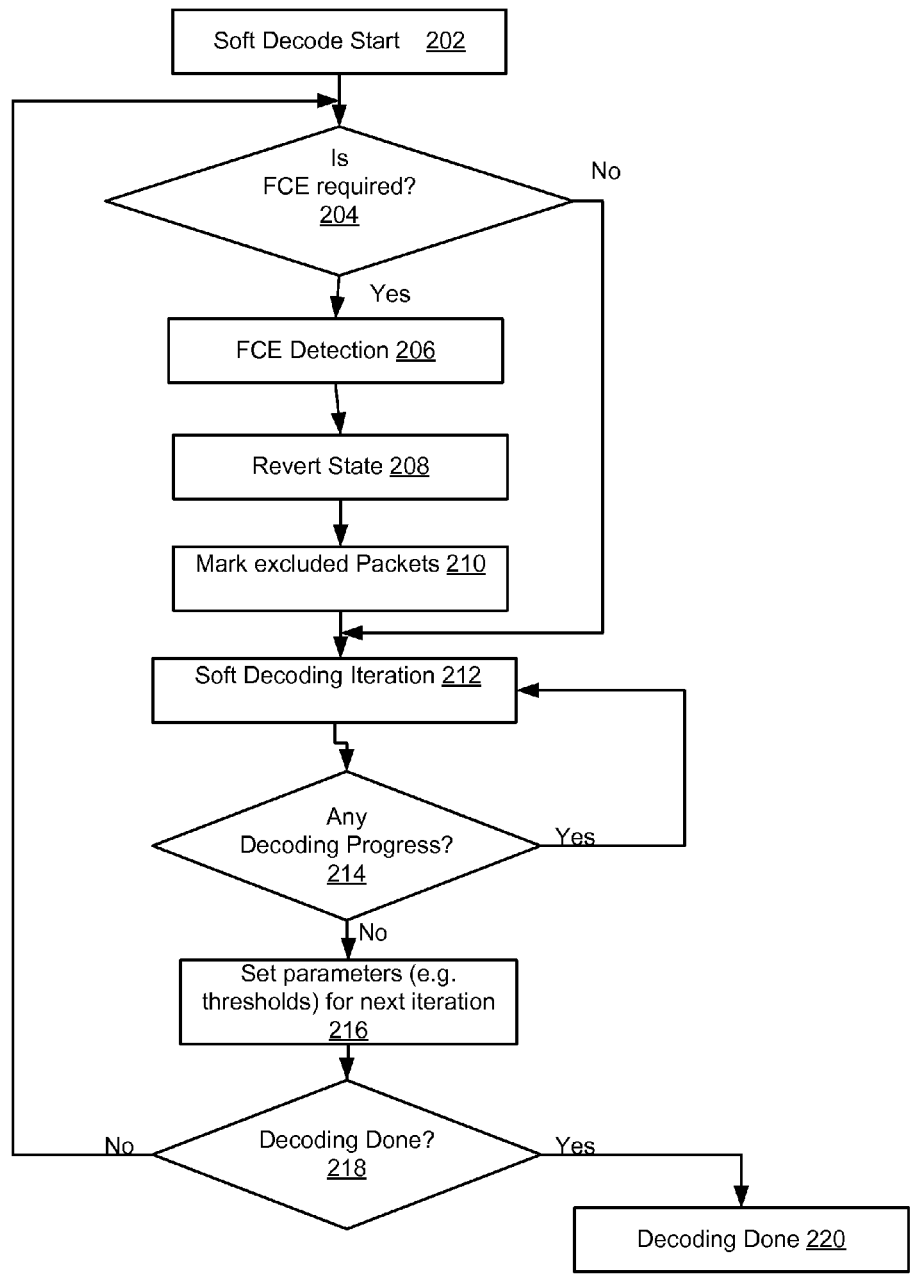
FIG. 2 illustrates a method according to an embodiment of the invention.

According to an embodiment of this invention, a soft decoding flow consists of soft FCE detection within a decoding flow, as illustrated in FIG. 2.

Figure 1B:
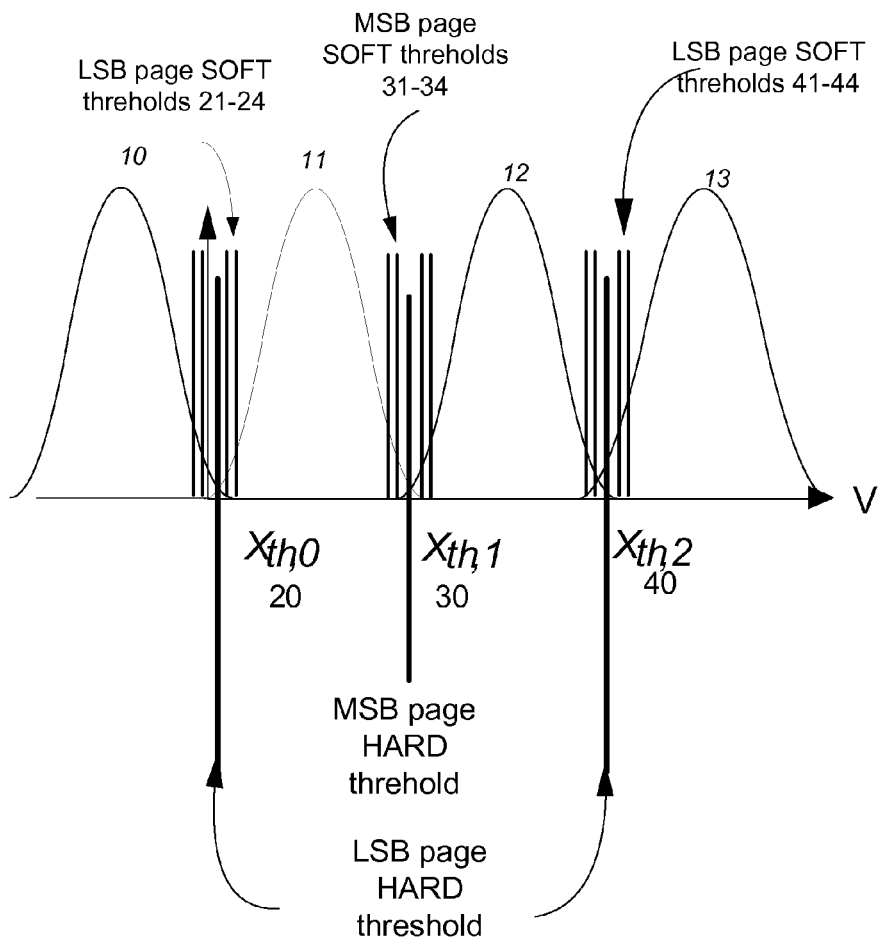
FIG. 1B illustrates a prior art threshold voltage distribution that has four lobes as well as hard decoding read thresholds and soft decoding read thresholds.

A flash controller issues a soft read command, which requires sampling at multiple thresholds, as exemplified in FIG. 1B.

The DSP assigns reliability values per cell following the soft read process. Then the decoder may receive soft input, which may be represented by LLR per bit. During the soft decoding an FCE decoding strategy is used, as disclosed in this invention. The FCE is used to achieve a higher decoding efficiency. It improves the probability of arriving at the original codeword and thus succeeds in decoding within a small number of iterations.

Soft FCE Decoding Flow—Overview

According to another embodiment of the invention, soft decoding uses FCE detection within soft decoding as demonstrated in FIG. 2. The main steps of the soft decoding with the FCE decoder include:

a. Right at soft decoding start (202), check (204) if detection is required. If detection is required, then FCE detection is performed. The FCE detection (206) stage includes performing under different conditions dummy iterations. During these dummy iterations, statistics are collected for every packet, as will be described later. The output of the FCE detection is a list of packets, which are to be excluded during the next iteration since they are suspected to result in false correction.

The criteria for decision on whether or not detection is required may be:

a. The number of unsolved packets is large enough, i.e. num_unsolved>FCE_UNSOLVED_TH. Such approach may be efficient since the more available solved packets, the lower is the probability of false correction. Thus at a point where enough packets are solved it is possible to perform full iterative decoding on all remaining packets with high success probability.

b. Complexity limitation that is after iteration counter is above some threshold iter>FCE_ITER_TH. It is usually important to have the detection activated on initial iterations, and from some iteration on, if decoding did not complete, perform full iterative decoding on all remaining packets.

c. Timer limitation, that is, if current decoding time exceeds some threshold, curr_timer>FCE_TIME_LIMIT then continue with full iterative decoding on all remaining packets, without using FCE detection, and increase probability that decoding will complete within a designated time, not exceeding a max-latency.

The next stage, if FCE detection was performed, is to revert back (208) the decoder state to its original state before FCE detection. This may include for example, in a BCH concatenated multi-dimensional code, recovering the syndrome values to their values before the dummy iterations of the FCE detection, recovering the list of codeword bit-errors to the list of bit-errors prior to FCE detection, etc.

The next stage, if FCE detection was performed, is to mark (210) the suspicious packets, provided by the detection stage, and avoid decoding these packets during the next iteration.

A decoding iteration may include performing decoding (212) of all packets, which were not excluded by the detection step. This may include all dimensions, or any partial subset of the dimensions, which can be used for soft decoding.

If decoding shows progress (214), i.e. there are some new successfully decoded packets during the current iteration, another decoding iteration can be done (jumping from stage 214 to stage 212).

Once there are no more new successfully decoded packets, can be tested by checking for example the CRC on the payload, when no CRC change is observed, there may be no decoding progress.

Parameters for next detection stage and decoding iteration are set (216). The parameters may include SUM_LLR_TH setting, DIFF_SUM_LLR threshold. These are parameters, which control acceptance of soft decoding result for a single packet.

At any stage if decoding is successful (checked in stage 218), e.g. by observing a zero CRC, decoding is done (220), otherwise decoder continues to next iteration (stage 218 is followed by stage 202).

The following table illustrates the relationship between the stages of method 200 of FIG. 2.

| Current stage | Condition | Next stage |
|---|---|---|
| 202 | | 204 |
| 204 | Is FCE required ? | YES - 206, NO - 212 |
| 206 | | 208 |
| 208 | | 210 |
| 210 | | 212 |
| 212 | | 214 |
| 214 | Any decoding progress | YES - 212, NO - 216 |
| 216 | | 218 |
| 218 | Decoding done ? | YES - 220, NO - 204 |

FCE Detection in Soft Decoding

Figure 3:
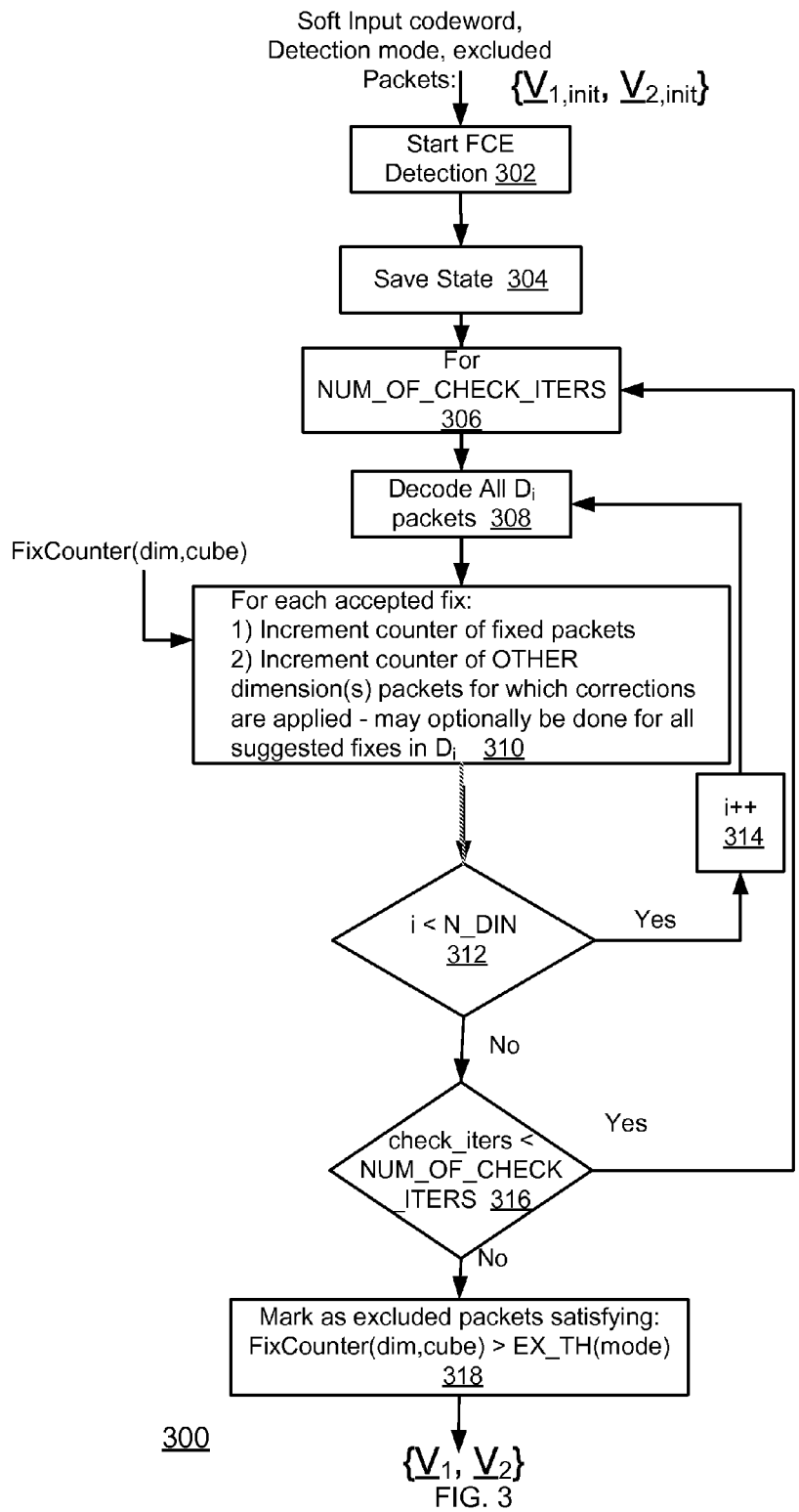
FIG. 3 illustrates a method according to an embodiment of the invention.

According to an embodiment of the invention, FCE detection 300 can be described as exemplified in FIG. 3.

The goal in FCE detection is to locate packets, which may introduce false corrections, and provide an output list of recommended packets for exclusion. Then the decoder uses only the non-excluded packets during decoding.

The detection begins (302) and the decoder state is stored (304), so that any decoding iteration done during the detection can be recovered, and the decoder state can be reverted to its original state before FCE. This may include for example, in a BCH concatenated multi-dimensional code, storing the syndrome values, and the list of codeword bit-errors found so far, etc.

The detection can include performing several iterations of decoding while computing scores per packet. In FIG. 3 for example, there are NUM_OF_CHECK_ITERS iterations (test state 308) of decoding for computing the detection scores.

The score can be for example FixCounter, which is a counter for every packet in the concatenated multi-dimensional code. It is initialized to all zeros at the beginning of the FCE detection. It may be updated during decoding as follows:

$$FixCounter(D_i, k) = \begin{cases} FixCounter(D_i, k) & DEC\_FAIL(D_i, k) \\ FixCounter(D_i, k) + 1 & DEC\_SUCC(D_i, k) \end{cases} \quad (5)$$

Where $D_i$ is the i-th dimension currently decoded (308), and k is the k-th packet in dimension $D_i$. Stage 310 includes increasing the counter for fixed packets FixCounter(Di,k) and updating a counter for another dimension packets that are affected by the corrections of the fixed packets of Di. DEC_FAIL is a decoding fail status of this packet, and DEC_SUCC is a decoding success status of this packet. It is noted that the score is incremented (310) by 1 for every successful decoding. Another type of score update that can be used is in addition or alone is illustrated in the following equation:

$$\forall j \neq i, \forall m \in M_j(E(k)), FixCounter(D_j, m) = FixCounter(D_j, m) + w_j, DEC\_SUCC(D_i, k) \quad (6)$$

Where $D_i$ is the i-th dimension currently decoded, and k is the k-th packet in dimension $D_i$. DEC_SUCC is a decoding success status of this packet, which is the condition for updating (310) the counters ($D_j$,m). For a given soft decoding success of ($D_i$,k), the update is applied to packets of other dimensions, for which errors are found in ($D_i$,k). That is, successful decoding of ($D_i$,k) provided a list of errors, given by E(k). For every dimension j≠i this list of errors may have impact on packets in dimension j. The mapping function $M_j$ translates the locations specified by E(k) to packet indices in dimension j. Every m is another packet index changed due to error list E(k). The score in $(D_j,m)$ is updated by a value $w_j$, which may be $w_j=1$ in a special case of a simple counter.

The motivation for providing these scores every iteration during the FCE detection is to check which packets are solved more than once. Packets with high FixCounter score may be packets, which introduce false corrections. As a false correction by some packet in dimension i is likely to be corrected (at least partially) by packets of other dimensions. Therefore, a packet, which indicates successful solving multiple times, in multiple iterations is likely to have a false correction.

This decoding of all packets of a certain dimension Di is executed for all dimensions—as illustrated by query stage 312 (i<N_DIN), and by incrementing index i in stage 314 (i++).

Therefore, after completing multiple iterations (limited by NUM_OF_CHECK_ITER in stage 316) of updating Fix-Counter, the excluded packets are those for which:

$$\text{FixCounter}(D_j,k) > EX\_TH(\text{mode}) \qquad (7)$$

Where EX TH(mode) is the decision threshold for marking (stage 318) packets as excluded, depending on the detection mode.

The following table illustrates the relationship between the stages of method 300 of FIG. 3.

| Current stage | Condition | Next stage |
|---|---|---|
| 302 | | 304 |
| 304 | | 306 |
| 306 | | 308 |
| 308 | | 310 |
| 310 | | 312 |
| 312 | i<N_DIN | YES - 314, NO - 316 |
| 314 | | 308 |
| 316 | Check_iters <NUM_OF_CHECK_ITERS | YES - 306, NO - 318 |

FCE Detection Modes

According to another embodiment of the invention, the detection mode can be controlled, so that different flavors of FCE detection can be tested, some or all of them. The FCE performs dummy decoding iterations. Within these dummy decoding iterations the decoder may have a configuration, which is different from its configuration during the normal decoding flow.

For example:
1. The decoding within the FCE detection can be identical in its operation to the basic decoding flow.
2. Decoding may be done without adding LLR-clipping to packets, which are solved within the decoding iterations of FCE. This might increase the detection probability by providing nearly equal weight to all dimensions tested.
3. Operation with decoding dimensions' re-ordering. That is, one of the parameters for the detection mode can be the dimensions order for decoding, which may be different from the order in the normal decoding flow.

FCE Detection Activation within Soft Decoding

According to another embodiment of the invention, the FCE detection may be activated multiple times in different detection modes. The conditions for multiple activations may vary according to results of last activation.

Figure 4:
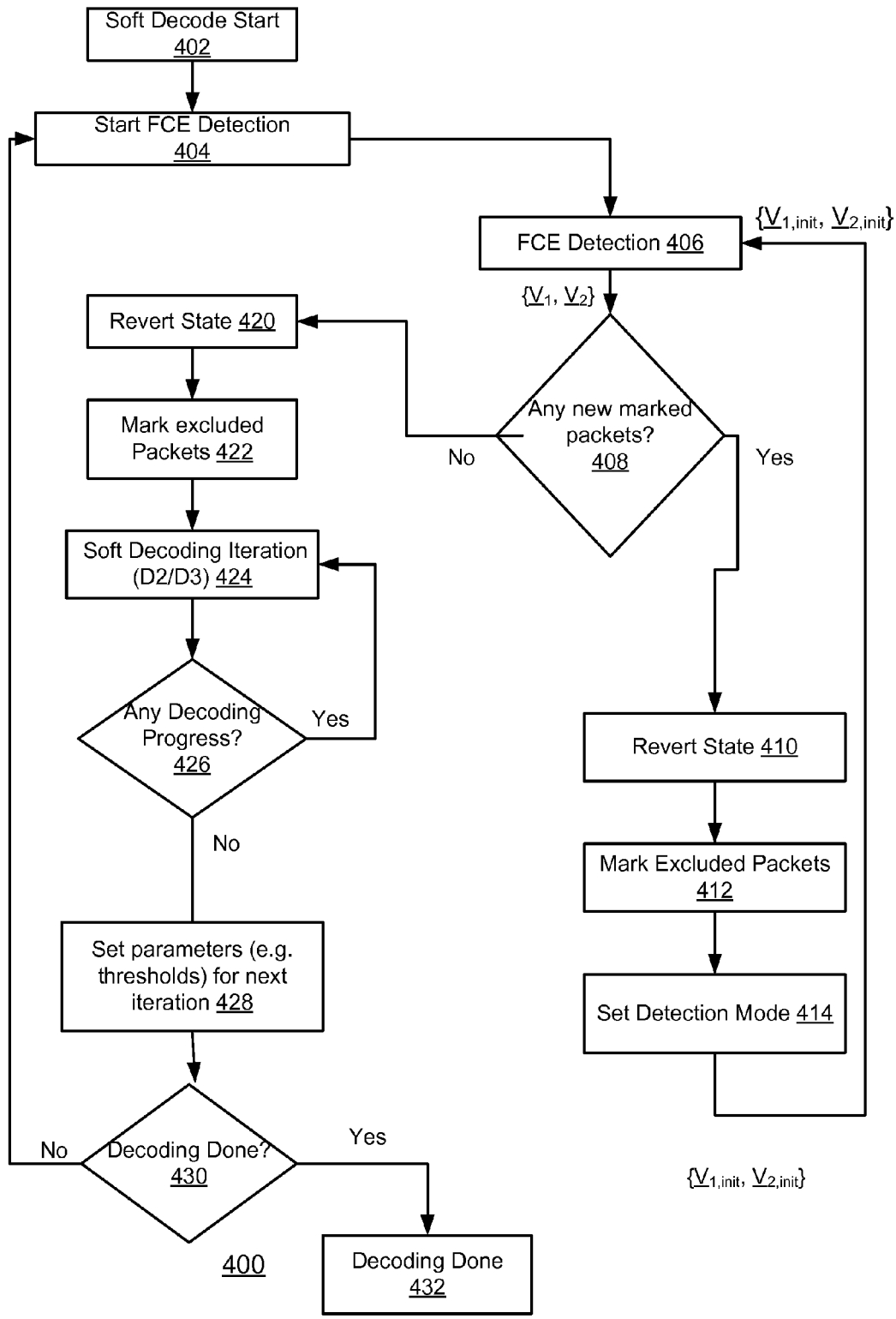
FIG. 4 illustrates a method according to an embodiment of the invention.

FIG. 4 provides another exemplary flow 400 according to an embodiment of the invention of soft decoding for multi-dimensional codes, using false correction elimination (FCE) detection and packet exclusion. As may be notices, when performing FCE, the initial conditions are usually no excluded packets. The inputs to the FCE Detection 406 are vectors $V_{1,init}$ and $V_{2,init}$, which are Boolean vectors and contain the exclude flag for each packet. Each vector is used for another dimension (for 3 dimension codes there are 3 such vectors). At the transition from state 404 to 406, which is the first call to the FCE detection following some decoding iterations, there are usually no excluded packets, which means that the input vectors $V_{1,init}$ and $V_{2,init}$ are all false (for all packets), i.e. no excluded packets when starting FCE detection. The output of the FCE detection 406 is another set of vectors $V_1$ and $V_2$, with indicator bits of excluded packets. Then, after FCE detection is done, it is tested whether or not there are new excluded packets detected. If new excluded packets are found, both vectors $V_{1,init}$ $V_{2,init}$ and $V_1$, $V_2$ are unified into a single result, i.e. V1(unified)={$V_{1,init} \cup V_1$}, and the same for every dimension. it is possible to use the currently available excluded packet list, activate the FCE detection again, and check whether or not there are new excluded packets added to the original list.

According to an embodiment of this invention, this may continue while setting the detection mode according to progress, setting the initial conditions for FCE detection with currently available exclude list, and activation of FCE detection again.

According to an embodiment of this invention, it is possible to activate the FCE detection multiple times and in different decoding modes if the list of excluded packet returned empty on last FCE activation.

The following table illustrates the relationship between the stages of method 400 of FIG. 4.

| Current stage | | Next stage |
|---|---|---|
| 402 | Soft decoding start | 404 |
| 404 | Start FCE detection | 406 |
| 406 | FCE detection | |
| 408 | Check if any new packets are marked? | YES - 410, NO - 420 |
| 410 | Revert state of decoder | 412 |
| 412 | Mark excluded packets | 414 |
| 414 | Set detection mode | 406 |
| 420 | Revert state of decoder | 422 |
| 422 | Mark excluded packets | 424 |
| 424 | Soft decoding iteration | 426 |
| 426 | Any decoding progress ? | YES - 424, NO - 428 |
| 428 | Set parameters for next iteration | |
| 430 | Decoding done ? | YES - 432 NO - 404 |
| 432 | Decoding done | |

FCE Detection Complexity Limitation

According to an embodiment of this invention, it is possible to configure the maximal number of FCE activations and overall overhead by using different limitations in the decoding flow. For example, at least one of the following stop conditions may be defined:

a. Set a maximal number of decoding iterations within the FCE decoding flow.
b. Set a maximal number of FCE activations after FCE detection started. That is, since a possible way to activate FCE is call it over and over with new excluded packets added to the excluded packets' list, and perhaps activation mode can change—there is a maximal number of activations to set before returning a new list to the decoder.
c. Limit the number of normal decoding operations, which use FCE detection, by using a threshold limit FCE_ITER_TH on the iteration count for which FCE is enabled.

d. Conditionally call the FCE if the number of unsolved packets exceeds some threshold.

Multi-Dimensional Hard Decoding Overview

The multi-dimensional hard decoding part of the invention assumes that the multi-dimensional codes underhand correspond to multi-dimensional folded BCH codes with encoding scheme as disclosed in U.S. patent application Ser. No. 12/651,489 titled ENCODING METHOD AND SYSTEM, DECODING METHOD AND SYSTEM.

Figure 5:
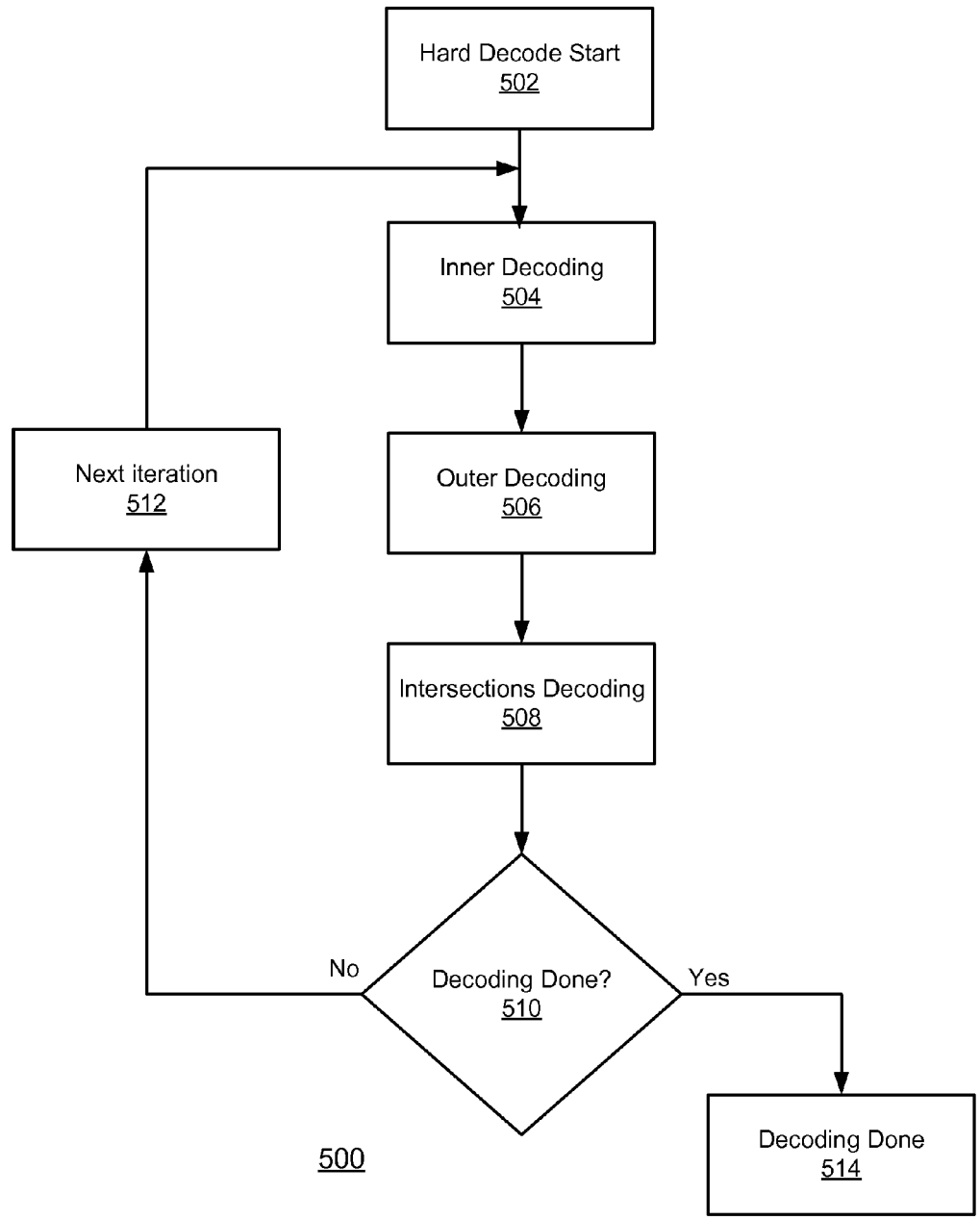
FIG. 5 illustrates a method according to an embodiment of the invention.

FIG. 5 illustrates a method 500 for multi-dimensional iterative hard decoding according to an embodiment of the invention. Method 500 starts (502). A basic iteration includes attempting to decode all the component codes, at each dimension. At the first iteration decoding may start with inner codes (inner decoding 504) which might have fast decoding capabilities and if decoding succeeds without outer and intersections decoding, the decoder may complete the decoding within a very short latency. The first several iterations may include inners decoding only, followed by outers decoding (506) if required, which may be followed by intersections decoding (508). As indicated above stage 506 and/or 508 may be skipped.

On some cases during the hard iterative decoding it may be beneficial to perform a complexity limited intersections decoding. A possible scenario for using intersections decoding (508) is when there are still some decoder packets (or component codes) which are not solved, and there was no progress of the hard iterative decoding. An exemplary intersection bit-set is the information bits associated with multiple distinct packets of different dimensions. The more packets used in every dimension, the smaller is the bit-set of intersection. For multi-dimensional folded BCH codes, the intersection bit-set length may change, as the component codes on the same dimension may differ in their length.

The main steps of intersections decoding include:
a. Mapping of bit-sets, which are obtained by intersections of non-solved packets on different dimensions.
b. Limit the intersections bit-sets list size.
c. Determine the dimensions for which decoding is to be applied.
d. Determine the number of bits for enumeration (Nb)—this specifies the enumeration complexity.
e. For every selected intersection set enumerate over the intersection bits, where every time another bit (or bits) is (are) inverted, and attempt decoding the corresponding component codes on the selected dimensions. This enables correcting t+Nb errors for a single component code.
f. Accept the inversion of Nb bits (of an intersection bit-set) if the number of successfully solved packets exceeds some threshold.

Using the results of outer decoding and intersections' decoding, and if decoding did not succeed yet (decoding done), another iteration (512) is performed by performing further inner decoding iterations. If decoding is done ending the process (514).

The following table illustrates the relationship between the stages of method 500 of FIG. 5.

| Current stage | | Next stage |
|---|---|---|
| 502 | Hard decoding start | 504 |
| 504 | Inner decoding | 506 |
| 506 | Outer decoding | 508 |
| 508 | Intersections decoding | 510 |
| 510 | Decoding done ? | YES - 514, NO - 512 |
| 512 | Next iteration | 504 |

Hard FCE Decoding

Figure 6:
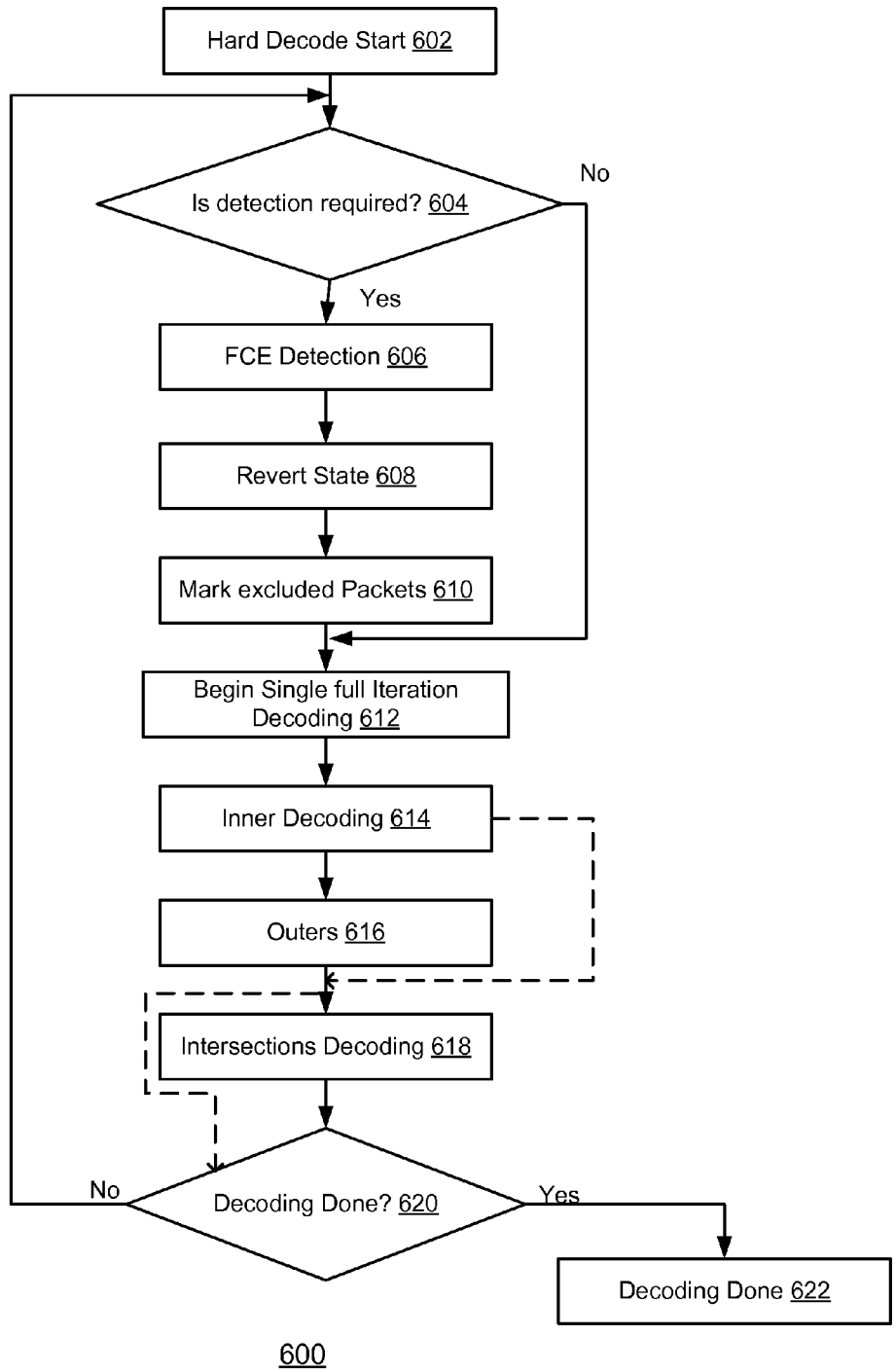
FIG. 6 illustrates a method according to an embodiment of the invention.

According to an embodiment of this invention, a hard decoding flow consists of hard FCE detection within a decoding flow, as exemplified in method 600 of FIG. 6. In the following, details on hard FCE activation conditions and different configurations are explained.

Hard FCE Decoding Flow

According to another embodiment of the invention, hard decoding uses FCE detection within hard decoding as demonstrated in FIG. 6. The main steps of the hard decoding with the FCE decoder include:

Start (602).

Right at hard decoding start, check (604) if detection is required. If detection is required, then FCE detection is performed (606). The FCE detection step includes performing under different conditions dummy iterations. During these dummy iterations statistics are collected for every packet, as will be described later. The output of the FCE detection is a list of packets, which are to be excluded during the next iteration since they are suspected to result in false correction. According to an embodiment of this invention, an exception can be made when performing outer decoding or intersections decoding (or both). That is, outer decoding may include packets, which are encoded differently, for example by a code for which decoding complexity is higher, may be configured to NOT take part in the FCE detection. Another example is when doing intersections decoding, the reliability of the decoding result may be increased due to the intersections decoding view of jointly decoding multiple packets on different dimensions. Therefore, the excluded packets' list may be configured to NOT be used in the iterative decoding, when performing intersections decoding.

The criteria for decision on whether or not detection is required may be, for example
a. The number of unsolved packets is small enough, i.e. num_solved>FCE_SOLVED_TH. Such approach may be efficient since the more available solved packets, the lower is the probability of false correction. Thus at a point where enough packets are solved it is possible to perform full iterative decoding on all remaining packets with high success probability.
b. Complexity limitation that is after iteration counter is above some threshold iter>FCE_ITER_TH. It is usually important to have the detection activated on initial iterations, and from some iteration on, if decoding did not complete, perform full iterative decoding on all remaining packets.
c. Timer limitation, that is, if current decoding time exceeds some threshold, curr_timer>FCE_TIME_LIMIT then continue with full iterative decoding on all remaining packets, without using FCE detection, and increase probability that decoding will complete within a designated time, not exceeding a max-latency.

The next step, if FCE detection was performed, is to revert back (608) the decoder state to its original state before FCE detection. This may include for example, in a BCH concatenated multi-dimensional code, recovering the syndrome values to their values before the dummy iterations of the FCE detection, recovering the list of codeword bit-errors to the list of bit-errors prior to FCE detection, etc.

The next step, if FCE detection was performed, is to mark (610) the suspicious packets, provided by the detection stage, and avoid decoding these packets during the next iteration.

If FCE was not executed or if executed and excluded packets were marked then the method proceeds by beginning a full iteration decoding (612). This may be followed by performing (614) inner decoding.

The inner decoding iteration may include performing decoding of all packets, which were not excluded by the detection step, and are defined as inner packets. This may include packets on part of the dimensions (or all dimensions). Usually, inner decoding includes decoding of packets, which inherently have low decoding complexity, and thus iterative inner decoding may have low latency.

If not all packets are solved, then try to use (616) outer decoding capabilities.

If decoding did not complete, and did not sufficiently progress in current iteration, then use intersections' decoding (618).

Stages 616 and 618 may be skipped as illustrated by dashed bypassing arrows.

At any stage if decoding is successful (evaluated by stage 620), e.g. by observing a zero CRC, decoding is done (stage 622), otherwise decoder continues to next iteration and jumping to stage 604.

The following table illustrates the relationship between the stages of method 600 of FIG. 6.

| Current stage | | Next stage |
|---|---|---|
| 602 | Hard decoding start | 604 |
| 604 | Is detection required | YES - 606, NO - 612 |
| 606 | FCE detection | 608 |
| 608 | Revert state of decoder | 610 |
| 610 | Mark excluded packets | 612 |
| 612 | Begin single full iteration decoding | 614 |
| 614 | Inner decoding | 616 or 620 |
| 616 | Outer decoding | 618 or 620 |
| 618 | Intersection decoding | 620 |
| 620 | Decoding done ? | YES - 622, NO - 604 |
| 622 | Decoding done | |

FCE Detection in Hard Decoding

Figure 7:
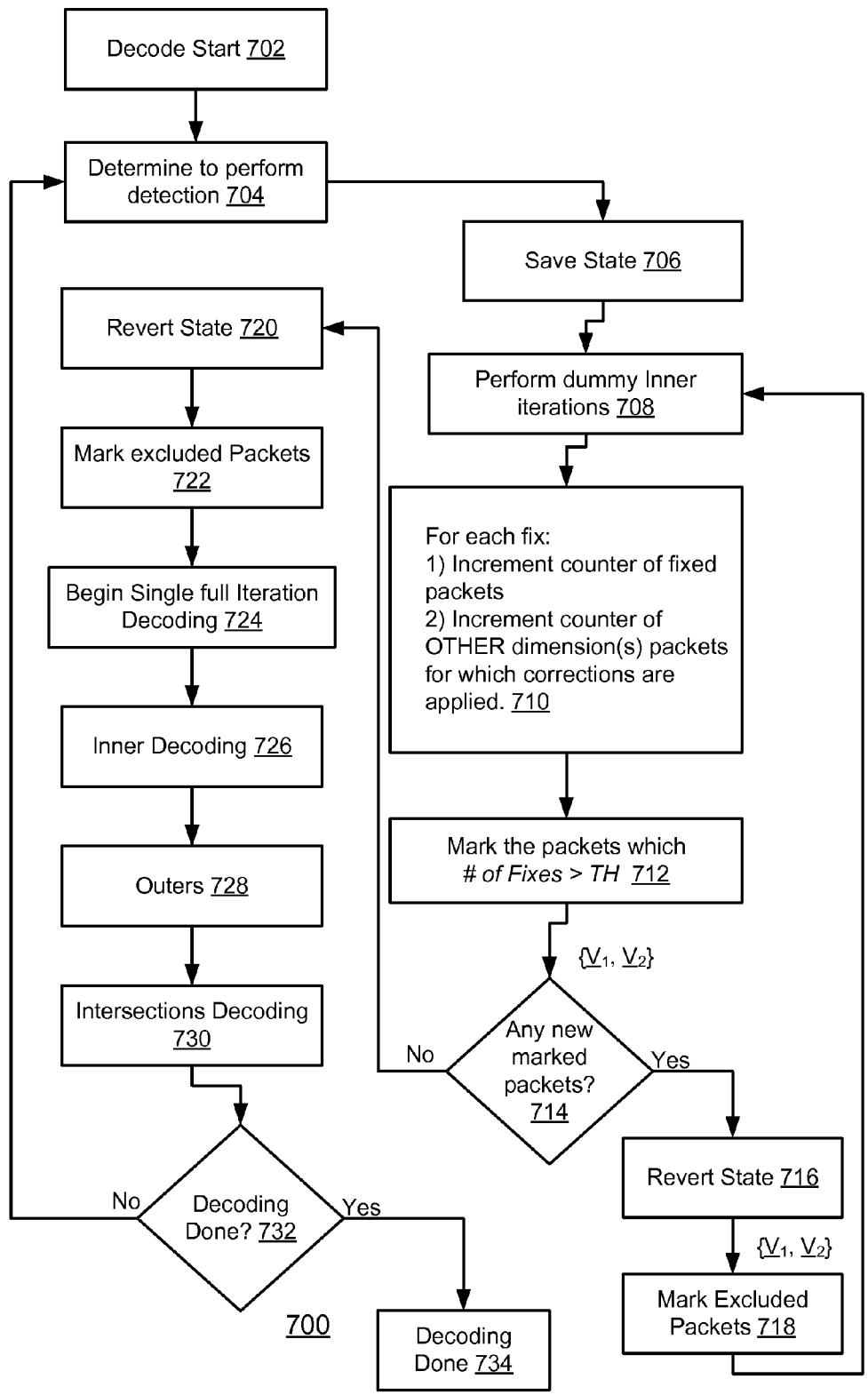
FIG. 7 illustrates a method according to an embodiment of the invention.

According to an embodiment of the invention, FCE detection 700 according to an embodiment of the invention can be described as exemplified in FIG. 7. The goal in FCE detection is to locate packets, which may introduce false corrections, and provide an output list of recommended packets for exclusion. Then the decoder uses only the non-excluded packets during decoding.

The detection begins by storing (706) the decoder state, so that any decoding iteration done during the detection can be recovered, and the decoder state can be reverted to its original state before FCE. This may include for example, in a BCH concatenated multi-dimensional code, storing the syndrome values, and the list of codeword bit-errors found so far, etc.

The detection can include performing several iterations of decoding while computing scores per packet. In FIG. 7 for example, there are inners only dummy iterations (708) of decoding for computing the detection scores. In this figure, the score in FixCounter is updated (710) in two ways for every packet, which is successfully solved, according to the following two rules. FixCounter is initialized to all zeros at the beginning of the FCE detection. It may be updated during decoding as follows:

$$FixCounter(D_i, k) = \begin{cases} FixCounter(D_i, k) & DEC\_FAIL(D_i, k) \\ FixCounter(D_i, k) + 1 & DEC\_SUCC(D_i, k) \end{cases} \quad (8)$$

Where $D_i$ is the i-th dimension currently decoded, and k is the k-th packet in dimension $D_i$. DEC_FAIL is a decoding fail status of this packet, and DEC_SUCC is a decoding success status of this packet. It is noted that the score is incremented by 1 for every successful decoding. Another type of score update that can be used together with the previous update or alone is illustrated in equation (9):

$$\forall j \neq i, \forall m \in M_j(E(k)), FixCounter(D_j, m) = FixCounter(D_j, m) + w_j, DEC\_SUCC(D_i, k)$$

Where $D_i$ is the i-th dimension currently decoded, and k is the k-th packet in dimension $D_i$. DEC_SUCC is a decoding success status of this packet, which is the condition for updating the counters ($D_j$,m). For a given hard decoding success of ($D_i$,k), the update is applied to packets of other dimensions, for which errors are found in ($D_i$,k). That is, successful decoding of ($D_i$,k) provided a list of errors, given by E(k). For every dimension j≠i this list of errors may have impact on packets in dimension j. The mapping function $M_j$ translates the locations specified by E(k) to packet indices in dimension j. Every m is another packet index changed due to error list E(k). The score in ($D_j$,m) is updated by a value $w_j$, which may be $w_j=1$ in a special case of a simple counter.

The motivation for providing these scores every iteration during the FCE detection is to check which packets are solved more than once. Packets with high FixCounter score may be packets, which introduce false corrections. As a false correction by some packet in dimension i is likely to be corrected (at least partially) by packets of other dimensions. Therefore, a packet, which indicates successful solving multiple times, in multiple iterations is likely to have a false correction.

Therefore, after completing multiple iterations of updating FixCounter, the excluded packets (712) are those for which $$FixCounter(D_i, k) > EX\_TH(mode)$$

Where EX_TH(mode) is the decision threshold for marking packets as excluded, depending on the detection mode.

The following table illustrates the relationship between the stages of method 700 of FIG. 7.

| Current stage | | Next stage |
|---|---|---|
| 702 | Decoding start | 704 |
| 704 | Is detection required | 706 (YES) |
| 706 | Save decoder state | 708 |
| 708 | Perform dummy inner iteration | 710 |
| 710 | Update for each fix counters | 712 |
| 712 | Mark excluded packets - # of fixes exceeds a threshold TH | 714 |
| 714 | Any new marked packets ? | YES - 716, NO - 720 |
| 716 | Revert state | 718 |
| 718 | Mark excluded packets | 708 |
| 720 | Revert state | 722 |
| 722 | Mark excluded packets | 724 |
| 724 | Begin single full iteration decoding | 726 |
| 726 | Inner decoding | 728 or 732 |
| 728 | Outer decoding | 730 or 732 |
| 730 | Intersection decoding | 732 |
| 732 | Decoding done ? | YES - 734, NO - 704 |
| 734 | Decoding done | |

Figure 8:
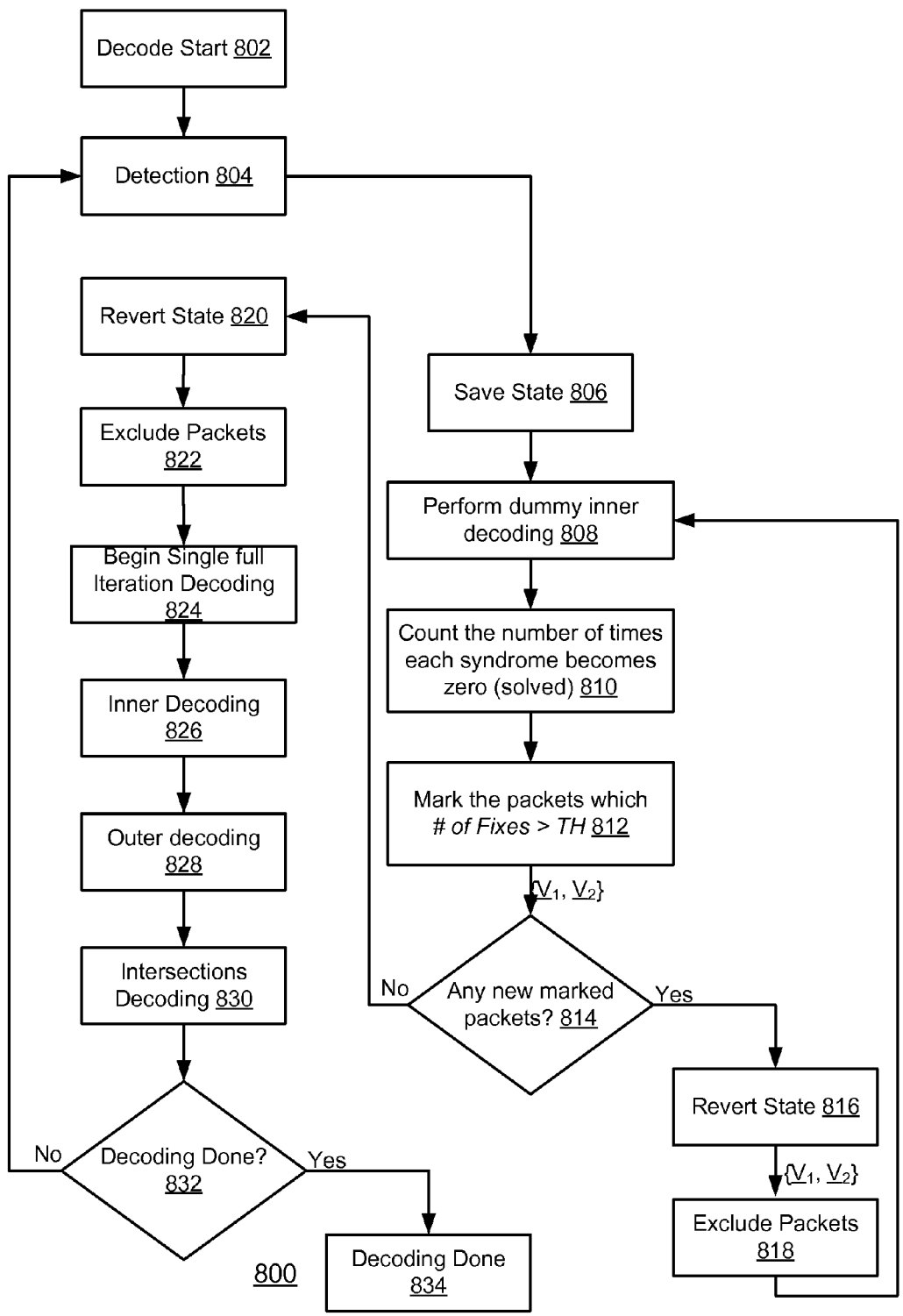
FIG. 8 illustrates a method according to an embodiment of the invention.

FIG. 8, demonstrates a hard decoding flow 800 for multi-dimensional codes according to an embodiment of the invention where the FCE detection uses only a single counter which counts successful fixes (number of times each syndrome becomes zero), see Eq. (8), during inner hard decoding of the FCE detection.

The following table illustrates the relationship between the stages of method 800 of FIG. 8.

| Current stage | | Next stage |
|---|---|---|
| 802 | Decoding start | 804 |
| 804 | Is detection required | 806 (YES) |
| 806 | Save decoder state | 808 |
| 808 | Perform dummy inner iteration | 810 |
| 810 | Update for each fix counters - count the number of times each syndrome becomes zero (solved) | 812 |
| 812 | Mark excluded packets - # of fixes exceeds a threshold TH | 814 |
| 814 | Any new marked packets ? | YES - 816, NO - 820 |
| 816 | Revert state | 818 |
| 818 | Mark excluded packets | 808 |
| 820 | Revert state | 822 |
| 822 | Mark excluded packets | 824 |
| 824 | Begin single full iteration decoding | 826 |
| 826 | Inner decoding | 828 or 832 |
| 828 | Outer decoding | 830 or 832 |
| 830 | Intersection decoding | 832 |
| 832 | Decoding done ? | YES - 834, NO - 804 |
| 834 | Decoding done | |

Figure 9:
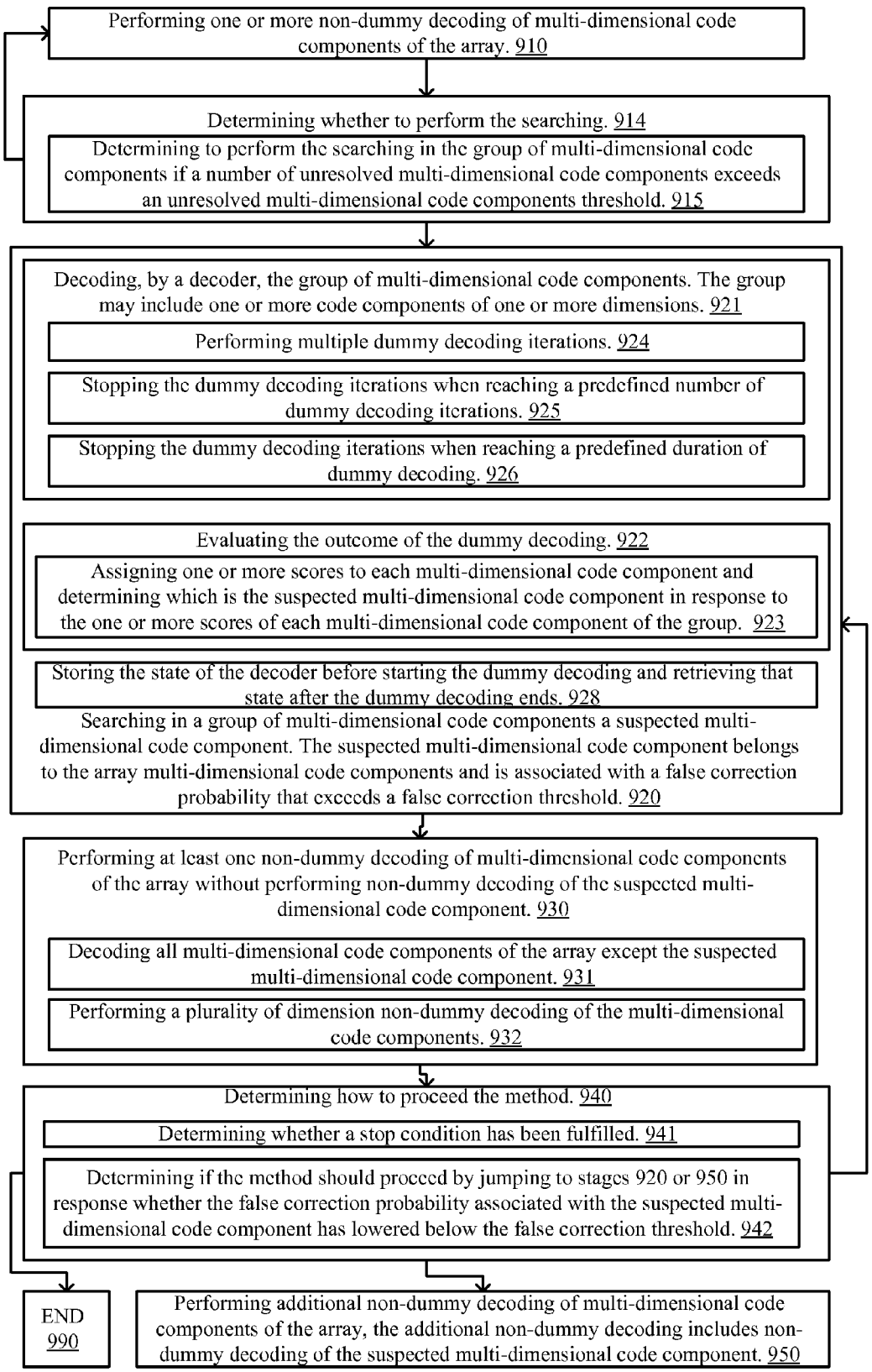
FIG. 9 illustrates a method according to an embodiment of the invention.

FIG. 9 illustrates method 900 according to an embodiment of the invention.

Method 900 may start by stages 920 or 910.

Stage 910 may include performing one or more non-dummy decoding of multi-dimensional code components of the array. An example of an array of code components is provided in FIG. 1A—matrix 100. The array may be a p dimensional array wherein p may exceed two.

Stage 910 may be followed by stage 920 or by stage 914 of determining whether to perform the searching. If so—jumping to stage 920. If not—jumping to stage 910. Stage 914 may include determining (915) to perform the searching in the group of multi-dimensional code components if a number of unresolved multi-dimensional code components exceeds an unresolved multi-dimensional code components threshold.

Stage 920 may include searching in a group of multi-dimensional code components a suspected multi-dimensional code component. The suspected multi-dimensional code component belongs to the array multi-dimensional code components and is associated with a false correction probability that exceeds a false correction threshold. The searching includes dummy decoding (921), by a decoder, the group of multi-dimensional code components. The group may include one or more code components of one or more dimensions.

The searching may also include evaluating (922) the outcome of the dummy decoding.

The evaluating (922) may include assigning (923) one or more scores to each multi-dimensional code component of the group of multi-dimensional code components and determining which of the multi-dimensional code components of the group of multi-dimensional code component is the suspected multi-dimensional code component in response to the at least one different scores of each multi-dimensional code component of the group of multi-dimensional code components.

The dummy decoding (921) may include performing (924) multiple dummy decoding iterations.

The dummy decoding (921) may include stopping (925) the dummy decoding iterations when reaching a predefined number of dummy decoding iterations, and/or stopping (926) the dummy decoding iterations when reaching a predefined duration of dummy decoding.

According to an embodiment of the invention the dummy decoding should not directly affect the state of the decoder that executed the non-dummy decoding of stage 930. This may be achieved by storing (stage 928) the state of the decoder before starting the dummy decoding and retrieving that state after the dummy decoding ends.

Stage 920 may be followed by stage 930 of performing at least one non-dummy decoding of multi-dimensional code components of the array without performing non-dummy decoding of the suspected multi-dimensional code component.

Stage 930 may include non-dummy decoding (931) all multi-dimensional code components of the array except the suspected multi-dimensional code component.

Stage 930 may include performing (932) a plurality of dimension non-dummy decoding of the multi-dimensional code components.

Stage 930 may be followed by stage 940 of determining how to proceed the method.

Stage 940 may determining whether (a) to stop the method, (b) to jump to stage 920, (c) to jump to stage 950.

Stage 940 may include determining (941) whether a stop condition has been fulfilled and if so—stopping the method (jump to END stage 990).

Non-limiting examples of stop conditions may include reaching a predefined number of repetitions of stages 920 and 930, reaching a decoding time limit, and the like.

Stage 940 may include determining (942) if the method should proceed by jumping to stage 920 or 950 in response whether the false correction probability associated with the suspected multi-dimensional code component has lowered below the false correction threshold. If so—jumping to stage 950. If not—jumping to stage 920.

Stage 950 may include performing additional non-dummy decoding of multi-dimensional code components of the array, the additional non-dummy decoding includes non-dummy decoding of the suspected multi-dimensional code component.

The dummy decoding may differ from the non-dummy decoding by at least one decoding parameter. The dummy decoding may be devised to have a higher false correction rate than the non-dummy decoding. The dummy decoding may be of different accuracy and/or error correction capabilities than the non-dummy decoding. Each one of the dummy decoding and the non-dummy decoding may include hard decoding, soft decoding, intersection decoding, list decoding or a combination thereof.

Stage 920 include performing FCE detection (see, for example, stages 206, 406, 606, 708-718, 808-818 of methods 200, 400, 600, 700 and 800 respectively).

Stage 930 may include executing decoding iterations that follow the FCE detection (see, for example, stages 212, 424, 612-618, 720-730 and 824-830 of methods 200, 400, 600, 700 and 800 respectively).

Figure 10:
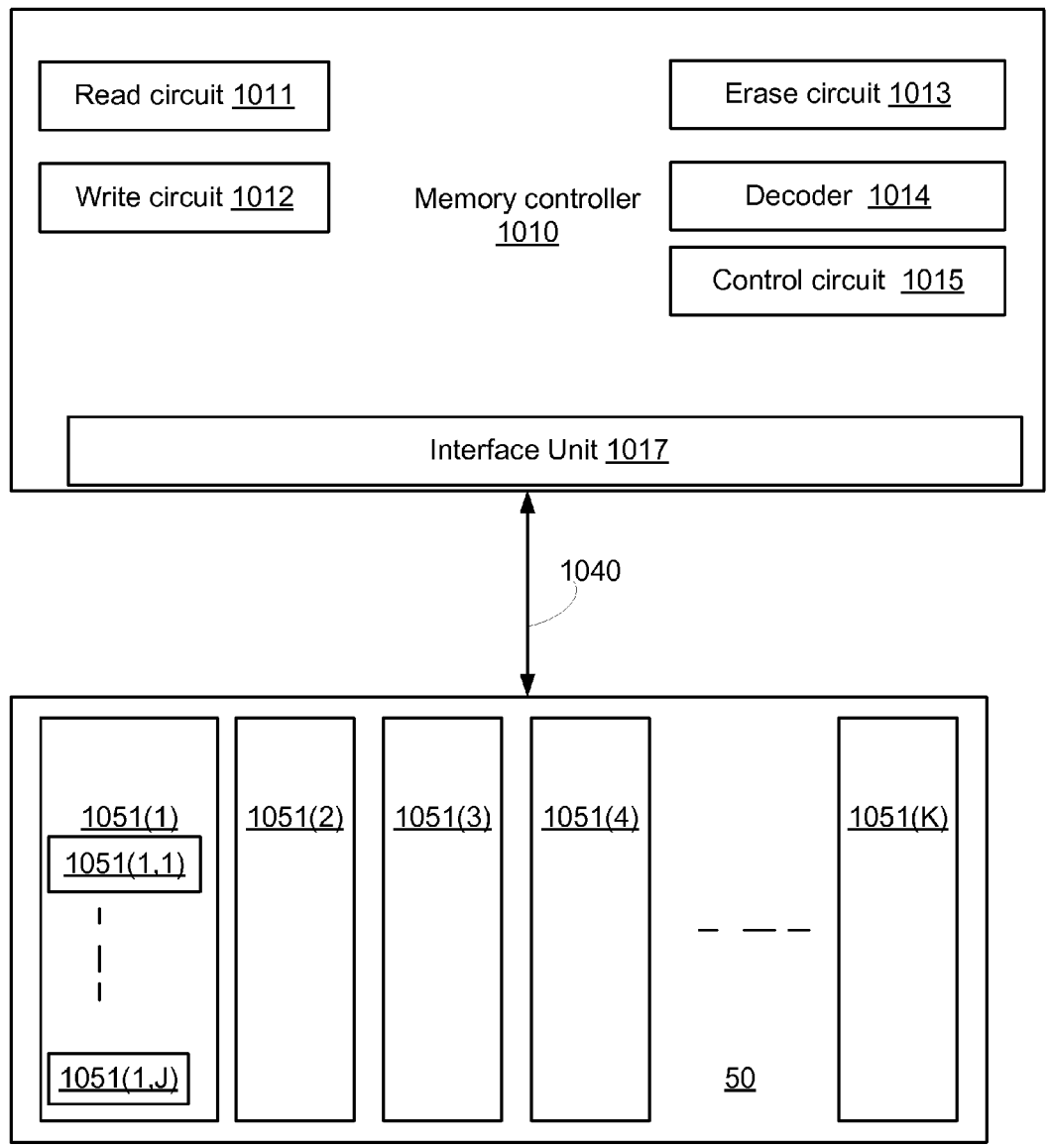
FIG. 10 illustrates a system according to an embodiment of the invention.

FIG. 10 illustrates a flash memory module 1050 and a memory controller 1010 according to an embodiment of the invention.

Memory controller 1010 is coupled via a communication link 1040 to the flash memory module 1050.

Memory controller 1010 may execute methods 200, 300, 400, 500, 600, 700, 800 and 900 or any combination of any stages of these methods.

Memory controller 1010 is shown as including read circuit 1011, write circuit 1012, erase circuit 1013, decoder 1014, control circuit 1015, and interface unit 1017.

Read circuit 1011 is arranged to assist in reading data from the flash memory module 1050. The assisting may include reading the data, instructing the flash memory module to read the data and output it (via interface unit 1017), and the like.

Write circuit 1012 is arranged to assist in writing data from the flash memory module 1050. Erase circuit 1013 is arranged to assist in erasing data from the flash memory module 1050.

Control circuit 1015 may be arranged to control the decoding process—for example determine whether to perform stage 920, control the execution of the FCE(for example enforce stop conditions, determine which packets to exludde, determining which type of decoding (inner, outer, hard, soft, intersections) to perform, set decoding parameters and the like.

Decoder 1014 may be arranged to perform dummy and non-dummy decoding.

Interface unit 1017 interfaces between the memory controller 1010 and the flash memory module 1050.

For example—decoder 1040 may be arranged to perform the dummy decoding and the non-dummy decoding while the control unit may evaluate the results of the dummy decoding and assist in the searching for the suspected multi-dimensional code component, which are excluded from a subset of decoding iterations, and re-assessed every set of iterations.

The flash memory module 1050 may include multiple erase blocks 1051(1)-1051(K), each erase block may include multiple pages. For example, erase block 1051(1) is illustrated as including pages 1051(1,1)-1051(1,J). K and J being positive integers. Each page includes multiple flash memory cells. The flash memory cells may be arranged in a NAND formation (although they may be arranged in other formations such as a NOR formation).

Figure 11:
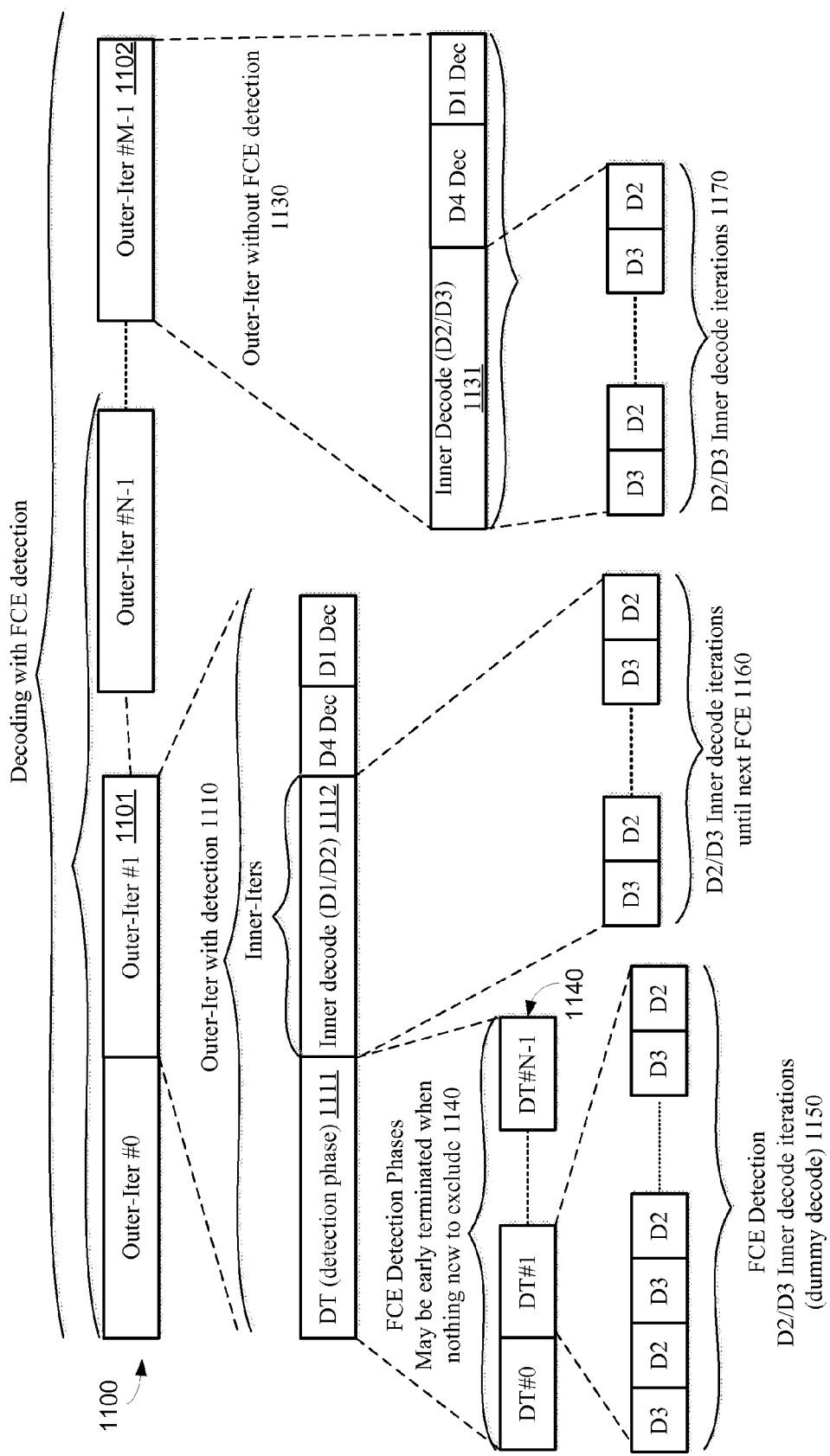
FIG. 11 illustrates a decoding scheme according to an embodiment of the invention.

FIG. 11 exemplifies a possible decode flow which includes FCE detection and decoding according to an embodiment of the invention.

An outer iteration #i refers to a set of decode operations, which may include FCE detection phases with dummy decoding, and then non-dummy decoding iterations, which account for excluded multi-dimensional suspected component codes obtained by the FCE detection phase. The group of outer iterations #0-#M−1 is denoted 1100.

For example, Outer-iter #1 1101 includes DT 111 which is an FCE detection phase, followed by inner decoding iterations 1112 of component codes in dimensions D2 and D3.

The inner-decode (D3/D2) phase 1112 operates on all component codes in D3 and D2 except for the excluded code components from the FCE detection phase.

The DT phase includes DT#0-DT#N−1 collectively denoted 1140 in DT#0. It may include, for example, a set of dummy D3/D2 decode iterations. During these dummy decode iterations a score is updated for every code component in D3 and D2. At the end of DT#0, the component codes with score values exceeding a threshold will be marked as excluded.

At the beginning of DT#0 there are usually no components marked as excluded. If after DT#i there are no new excluded components, then the DT phase may early terminate, and inner decode of D3 and D2 may be continued.

Once inner-decode (D3/D2) is done, decoding of components in other dimensions, such as D4 and D1 may be applied. (See, for example inner decode (D3/D2) of outer-iter without FCE detection 1130 followed by D4 decoding and D1 decoding Inner Decode (D3/D2) 1131 includes multiple D3/D2 inner decode iterations 1170.

Inner decode (D3/D2) 1112 includes multiple D3/D2 inner decode iterations 1160.

This is to exemplify that FCE detection does not need to take place on all multi-dimensional code components, and may be implemented for efficiency on components in dimensions with high speed decoding capabilities, for example.

Advanced outer iterations, e.g. Outer-iter #M−1 may be done by without an FCE detection phase, this is usually determined by comparing the number of unsolved component codes to a threshold, and if this number is smaller than the threshold, a normal decoding phase such as Outer-iter #M−1 can take place.

Another criterion may be a threshold limit on the number of outer iterations employing FCE detection. This is intended to limit the decoding complexity and/or to allow non-dummy decoding of all unsolved component codes until codeword is successfully decoded.

Two non-limiting examples of some of the dimensions illustrated in FIG. 11 are provided in FIG. 2 of U.S. Pat. No. 8,341,502 and FIG. 6 of US application 20100253555 respectively, both patent and patent application assigned to the same assignee of the current patent application and both being incorporated herein by reference.

Inner decode (dimensions D2 and D3 of FIG. 11) may be the decoding of packets termed D2 and D3 in FIG. 2 of U.S. Pat. No. 8,341,502 and FIG. 6 of US application 20100253555 respectively. The "D1 decode" of FIG. 11 may be D1 decoding of FIG. 2 of U.S. Pat. No. 8,341,502 and FIG. 6 of US application 20100253555 respectively. Decode of D4 of FIG. 11 ("D4 decode") may be a decoding of parity redundancy code packet D4 of FIG. 2 of U.S. Pat. No. 8,341,502 and FIG. 6 of US application 20100253555 respectively.

The invention may also be implemented in a computer program for running on a computer system, at least including code portions for performing steps of a method according to the invention when run on a programmable apparatus, such as a computer system or enabling a programmable apparatus to perform functions of a device or system according to the invention. The computer program may cause the storage system to allocate disk drives to disk drive groups.

A computer program is a list of instructions such as a particular application program and/or an operating system. The computer program may for instance include one or more of a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on a non-transitory computer readable medium. All or some of the computer program may be provided on computer readable media permanently, removably or remotely coupled to an information processing system. The computer readable media may include, for example and without limitation, any number of the following magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. In addition, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein may be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. Moreover, if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A method of decoding an array of multi-dimensional code components, the method comprising:
searching in a group of multi-dimensional code components a suspected multi-dimensional code component, wherein the suspected multi-dimensional code component belongs to the array multi-dimensional code components and is associated with a false correction probability that exceeds a false correction threshold; wherein the searching comprises dummy decoding, by a decoder, the group of multi-dimensional code components; and
performing at least one non-dummy decoding of multi-dimensional code components of the array without performing non-dummy decoding of the suspected multi-dimensional code component.

2. The method according to claim 1 wherein the searching is preceded by performing one or more non-dummy decoding of multi-dimensional code components of the array.

3. The method according to claim 1 wherein the searching is followed by setting a decoder state to a decoder state that existed immediately before searching for the suspected multi-dimensional code component.

4. The method according to claim 1 wherein the performing of the at least one non-dummy decoding is followed by performing additional non-dummy decoding of multi-dimensional code components of the array, the additional non-dummy decoding comprise non-dummy decoding of the suspected multi-dimensional code component.

5. The method according to claim 1 wherein the performing of the at least one non-dummy decoding is followed by performing a new multi-dimensional code components search for new suspected multi-dimensional code components, followed by additional non-dummy decoding of multi-dimensional code components that differ from the new suspected multi-dimensional code components.

6. The method according to claim 4 wherein the performing of the additional non-dummy decoding is preceded by checking, after performing the at least one non-dummy decoding of multi-dimensional code components of the array, the false correction probability associated with the suspected multi-dimensional code component and determining that the false correction probability associated with the suspected multi-dimensional code component has lowered below the false correction threshold.

7. The method according to claim 1 wherein the performing of the at least one non-dummy decoding of the multi-dimensional code components comprises non-dummy decoding all multi-dimensional code components of the array except the suspected multi-dimensional code component.

8. The method according to claim 1 wherein the performing of the at least one non-dummy decoding of the multi-dimensional code components comprises performing a plurality of dimension non-dummy decoding of the multi-dimensional code components.

9. The method according to claim 1 comprising preforming multiple repetitions of a sequence of stages that comprises (a) the searching for the suspected multi-dimensional code component and (b) the performing of the at least one non-dummy decoding of the multi-dimensional code components of the array without performing non-dummy decoding of the suspected multi-dimensional code component.

10. The method according to claim 8 comprising limiting a number of repetitions of the sequence of stages.

11. The method according to claim 1 wherein the dummy decoding differs from the non-dummy decoding by at least one decoding parameter.

12. The method according to claim 1 wherein the multi-dimensional code components are associated with a set of dimensions and wherein the searching for the suspected multi-dimensional code component comprises searching in code components associated with a sub-set of the dimensions.

13. The method according to claim 1 wherein the searching comprises assigning to each multi-dimensional code component of the group of multi-dimensional code components at least two different scores; and determining which of the multi-dimensional code components of the group of multi-dimensional code component is the suspected multi-dimensional code component in response to the at least two different scores of each multi-dimensional code component of the group of multi-dimensional code components.

14. The method according to claim 1 wherein the searching comprises assigning to each multi-dimensional code component of the group of multi-dimensional code components at least one score; and determining which of the multi-dimensional code components of the group of multi-dimensional code component is the suspected multi-dimensional code component in response to the at least one score of each multi-dimensional code component of the group of multi-dimensional code components.

15. The method according to claim 1 wherein the searching comprises assigning to each multi-dimensional code component of the group of multi-dimensional code components a score indicative of a number of times the code component was corrected.

16. The method according to claim 1 wherein the dummy decoding comprises performing multiple dummy decoding iterations.

17. The method according to claim 15 comprising stopping the dummy decoding iterations when reaching a predefined number of dummy decoding iterations.

18. The method according to claim 15 comprising stopping the dummy decoding iterations when reaching a predefined duration of dummy decoding.

19. The method according to claim 1 comprising determining to perform the searching in the group of multi-dimensional code components if a number of unresolved multi-dimensional code components exceeds an unresolved multi-dimensional code components threshold.

20. The method according to claim 11 wherein the performing of the at least one non-dummy decoding of multi-dimensional code components of the array comprises non-dummy decoding of multi-dimensional code components associated with more than the subset of dimensions without performing non-dummy decoding of the suspected multi-dimensional code component.

21. A non-transitory computer readable medium that stores instructions that once executed by a memory controller cause the memory controller to:
search in a group of multi-dimensional code components a suspected multi-dimensional code component, wherein the suspected multi-dimensional code component belongs to an array of multi-dimensional code components and is associated with a false correction probability that exceeds a false correction threshold; wherein the searching comprises dummy decoding, by a decoder, the group of multi-dimensional code components; and perform at least one non-dummy decoding of multi-dimensional code components of the array without performing non-dummy decoding of the suspected multi-dimensional code component.

22. A device comprising a memory controller and a non-volatile memory device; wherein the memory controller is arranged to:

search in a group of multi-dimensional code components a suspected multi-dimensional code component, wherein the suspected multi-dimensional code component belongs to an array of multi-dimensional code components and is associated with a false correction probability that exceeds a false correction threshold; wherein the searching comprises dummy decoding, by a decoder, the group of multi-dimensional code components; and perform at least one non-dummy decoding of multi-dimensional code components of the array without performing non-dummy decoding of the suspected multi-dimensional code component.

* * * * *